United States Patent
Choi et al.

(10) Patent No.: US 7,582,515 B2
(45) Date of Patent: Sep. 1, 2009

(54) MULTI-JUNCTION SOLAR CELLS AND METHODS AND APPARATUSES FOR FORMING THE SAME

(75) Inventors: Soo-Young Choi, Fremont, CA (US); Yong-Kee Chae, Pleasanton, CA (US); Shuran Sheng, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 302 days.

(21) Appl. No.: 11/671,988

(22) Filed: Feb. 6, 2007

(65) Prior Publication Data

US 2008/0188033 A1 Aug. 7, 2008

Related U.S. Application Data

(63) Continuation-in-part of application No. 11/624,677, filed on Jan. 18, 2007.

(51) Int. Cl.
*H01L 21/20* (2006.01)
(52) U.S. Cl. .................. 438/141; 438/91; 438/380; 438/FOR. 415; 257/E31.047; 257/656
(58) Field of Classification Search ............. 257/656; 438/91, 141, 380, FOR. 415
See application file for complete search history.

(56) References Cited

U.S. PATENT DOCUMENTS

| | | | |
|---|---|---|---|
| 4,737,196 A * | 4/1988 | Yukimoto | 136/249 |
| 4,841,908 A | 6/1989 | Jacobson et al. | |
| 5,256,887 A | 10/1993 | Yang | |
| 5,403,404 A * | 4/1995 | Arya et al. | 136/249 |
| 5,730,808 A | 3/1998 | Yang et al. | |
| 5,942,050 A | 8/1999 | Green et al. | |
| 6,100,466 A | 8/2000 | Nishimoto | |
| 6,121,541 A | 9/2000 | Arya | |
| 6,190,932 B1 | 2/2001 | Yoshimi et al. | |
| 6,200,825 B1 | 3/2001 | Yoshimi et al. | |
| 6,265,288 B1 | 7/2001 | Okamoto et al. | |
| 6,288,325 B1 | 9/2001 | Jansen et al. | |
| 6,297,443 B1 | 10/2001 | Nakajima et al. | |
| 6,309,906 B1 | 10/2001 | Meier et al. | |
| 6,326,304 B1 | 12/2001 | Yoshimi et al. | |
| 6,337,224 B1 | 1/2002 | Okamoto et al. | |
| 6,566,159 B2 | 5/2003 | Sawada et al. | |

(Continued)

FOREIGN PATENT DOCUMENTS

JP 0 994 515 A2 4/2000

(Continued)

OTHER PUBLICATIONS

B. Rech et al article, "Amorphous and Microcrystalline Silicon Solar Cells Prepared at High Deposition Rates Using RF (13.56 MHz) Plasma Excitation Frequencies." Solar Energy Materials & Solar Cells 66 (2001), pp. 267-273.

(Continued)

*Primary Examiner*—Thanh V Pham
*Assistant Examiner*—Errol Fernandes
(74) *Attorney, Agent, or Firm*—Patterson & Sheridan, LLP (57) ABSTRACT

Embodiments of the present invention generally relate to solar cells and methods and apparatuses for forming the same. More particularly, embodiments of the present invention relate to thin film multi-junction solar cells and methods and apparatuses for forming the same.

23 Claims, 6 Drawing Sheets

U.S. PATENT DOCUMENTS

| | | | |
|---|---|---|---|
| 7,074,641 B2 | 7/2006 | Kondo et al. | |
| 2001/0051388 A1 | 12/2001 | Shiozaki et al. | |
| 2003/0013280 A1 | 1/2003 | Yamanaka | |
| 2003/0041894 A1 | 3/2003 | Sverdrup, Jr. et al. | |
| 2003/0044539 A1 | 3/2003 | Oswald | |
| 2003/0104664 A1 | 6/2003 | Kondo et al. | |
| 2005/0189012 A1 | 9/2005 | Kondo et al. | |
| 2005/0251990 A1 | 11/2005 | Choi et al. | |
| 2006/0060138 A1 | 3/2006 | Keller et al. | |
| 2006/0249196 A1 | 11/2006 | Shima | |
| 2006/0283496 A1 | 12/2006 | Okamoto et al. | |
| 2007/0039942 A1 | 2/2007 | Leung et al. | |
| 2007/0151596 A1* | 7/2007 | Nasuno et al. | 136/256 |
| 2008/0185036 A1* | 8/2008 | Sasaki et al. | 136/252 |

OTHER PUBLICATIONS

Platz et al article, "H2-Dilution vs. Buffer Layers for Increased VOC." Institut de Microtechnique, Universite de Neuchatel, Rue A.-L. Breguet 2, CH-2000 Neuchatel, Switzerland.

PCT International Search Report and Written Opinion dated Jun. 27, 2008 for International Application No. PCT/US2008/50770. (APPM/011709-PCT).

O. Vetterl, et al "Preparation Temperature Effects in Microcrystalline Silicon Thin Film Solar Cells", Mat. Res. Soc. Symp. Proc. vol. 664 p. A 25.8.1—A 25.8.6, 2001.

Stefan Klein, et al. "Microcrystalline Silicon Prepared by Hot-Wire Chemical Vapor Deposition for Thin Film Solar Cell Applications", Jpn J. Appl. Phys. vol. 41(2002)pp. L Jan. 10-12, 2002.

S. Klein, et al "High Efficiency Thin Film Solar Cells with Instrinsic Microcrystalline Silicon Prepared by Hot Wire CVD" Mat. Res. Soc. Symp. Proc. vol. 715 © 2002 Materials Research Society, pp. A26.2.1-A 26.2.6.

Ujjwal K. Das et al "Amorphous and Microcrystalline silicon Solar Cells Grown by Pulsed PECVD Technique", Mat. Res. Soc. Symp. Proc. vol. 715 © 2002 Materials Research Society pp. A. 26.6.1-A 26.6.6.

* cited by examiner

| LAYER | Gas (sccm) | | | | | RF (W) | Pres. (Torr) | Time (Sec) | Thick (Å) | D/R (Å/min) |
|---|---|---|---|---|---|---|---|---|---|---|
| | SiH4 | H2 | PH3 (0.5%) | TMB (0.5%) | CH4 | | | | | |
| (1) p-aSi:C | 590 | 3000 | | 400 | 800 | 270 | 2.5 | 17 | 100 | 348 |
| (2) i-aSi | 600 | 5000 | | | | 230 | 2.0 | 698 | 2600 | 224 |
| (3) n-aSi | 900 | 4400 | 150 | | | 470 | 1.5 | 5 | 50 | 565 |
| (4) n+mcSi | 60 | 18000 | 60 | | | 1500 | 9.0 | 92 | 200 | 130 |
| (5) p+mcSi | 75 | 48750 | | 30 | | 1500 | 9.0 | 92 | 200 | 130 |
| (6) i-mcSi | 165 | 14025 | | | | 1500 | 6.0 | 847 | 5000 | 354 |
| (7) i-mcSi | 165 | 13324 | | | | 1500 | 6.0 | 833 | 5000 | 360 |
| (8) i-mcSi | 165 | 12623 | | | | 1500 | 6.0 | 820 | 5000 | 366 |
| (9) i-mcSi | 165 | 11921 | | | | 1500 | 6.0 | 806 | 5000 | 372 |
| (10) n-aSi | 900 | 4400 | 150 | | | 470 | 1.5 | 18 | 200 | 657 |
| (11) n-aSi | 60 | | 500 | | | 470 | 1.5 | 17 | 80 | 282 |

FIG. 6

| Initial Cell Efficiency (%) | 11.00 |
|---|---|
| Jsc (mA/cm$^2$) | 11.0 |
| Voc (V) | 1.363 |
| FF (%) | 73.5 |

MULTI-JUNCTION SOLAR CELLS AND METHODS AND APPARATUSES FOR FORMING THE SAME

CROSS-REFERENCE TO RELATED APPLICATIONS

This application is a continuation-in part of co-pending U.S. patent application Ser. No. 11/624,677, filed Jan. 18, 2007.

BACKGROUND OF THE INVENTION

1. Field of the Invention

Embodiments of the present invention generally relate to solar cells and methods and apparatuses for forming the same. More particularly, embodiments of the present invention relate to thin film multi-junction solar cells and methods and apparatuses for forming the same.

2. Description of the Related Art

Crystalline silicon solar cells and thin film solar cells are two types of solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-n junctions. Suitable substrates include glass, metal, and polymer substrates.

Problems with current thin film solar cells include low efficiency and high cost. Therefore, there is a need for improved thin film solar cells and methods and apparatuses for forming the same in a factory environment.

SUMMARY OF THE INVENTION

Embodiments of the present invention relate to thin film multi-junction solar cells and methods and apparatuses for forming the same. In one embodiment, a method of forming a thin film multi-junction solar cell over a substrate comprises forming a first p-i-n junction and forming a second p-i-n junction over the first p-i-n junction. Forming a first p-i-n junction may comprise forming a p-type amorphous silicon layer, forming an intrinsic type amorphous silicon layer over the p-type amorphous silicon layer, and forming an n-type microcrystalline silicon layer over the intrinsic type amorphous silicon layer. Forming a second p-i-n junction may comprise forming a p-type microcrystalline silicon layer, forming an intrinsic type microcrystalline silicon layer over the p-type microcrystalline silicon layer, and forming an n-type amorphous silicon layer over the intrinsic type microcrystalline layer. In one embodiment, an apparatus for forming a thin film multi-junction solar cell comprises at least one first system configured to form a first p-i-n junction and at least one second system configured to form a second p-i-n junction over the first p-i-n junction. The first system may comprise a single p-chamber configured to deposit a p-type amorphous silicon layer and a plurality of i/n-chambers each configured to deposit an intrinsic type amorphous silicon layer and an n-type microcrystalline silicon layer. The second system may comprise a single p-chamber configured to deposit a p-type microcrystalline silicon layer and a plurality of i/n-chambers each configured to deposit an intrinsic type microcrystalline silicon layer and an n-type amorphous silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
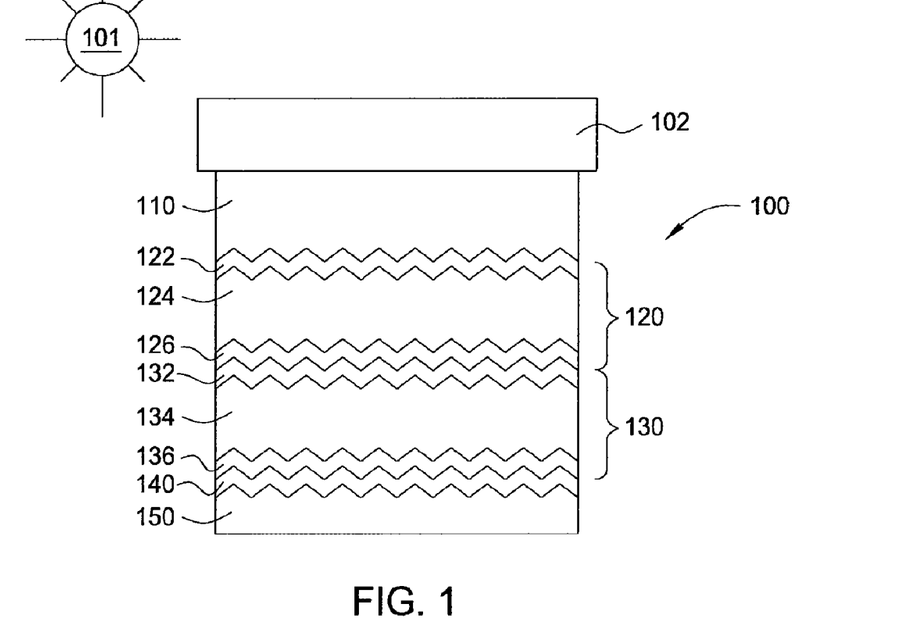
FIG. 1 is a schematic diagram of certain embodiments of a multi-junction solar cell oriented toward the light or solar radiation.

Embodiments of the present invention include improved thin film multi-junction solar cells and methods and apparatus for forming the same. FIG. 1 is a schematic diagram of certain embodiments of a multi-junction solar cell 100 oriented toward the light or solar radiation 101. Solar cell 100 comprises a substrate 102, such as a glass substrate, polymer substrate, metal substrate, or other suitable substrate, with thin films formed thereover. The solar cell 100 further comprises a first transparent conducting oxide (TCO) layer 110 formed over the substrate 102, a first p-i-n junction 120 formed over the first TCO layer 110, a second p-i-n junction 130 formed over the first p-i-n junction 120, a second TCO layer 140 formed over the second p-i-n junction 130, and a metal back layer 150 formed over the second TCO layer 140. To improve light absorption by reducing light reflection, the substrate and/or one or more of thin films formed thereover may be optionally textured by wet, plasma, ion, and/or mechanical processes. For example, in the embodiment shown in FIG. 1, the first TCO layer 110 is textured and the subsequent thin films deposited thereover will generally follow the topography of the surface below it.

The first TCO layer 110 and the second TCO layer 140 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum. In certain instances, the substrate 102 may be provided by the glass manufacturers with the first TCO layer 110 already provided.

The first p-i-n junction 120 may comprise a p-type amorphous silicon layer 122, an intrinsic type amorphous silicon layer 124 formed over the p-type amorphous silicon layer 122, and an n-type microcrystalline silicon layer 126 formed over the intrinsic type amorphous silicon layer 124. In certain embodiments, the p-type amorphous silicon layer 122 may be formed to a thickness between about 60 Å and about 300 Å. In certain embodiments, the intrinsic type amorphous silicon layer 124 may be formed to a thickness between about 1,500 Å and about 3,500 Å. In certain embodiments, the n-type microcrystalline semiconductor layer 126 may be formed to a thickness between about 100 Å and about 400 Å.

The second p-i-n junction 130 may comprise a p-type microcrystalline silicon layer 132, an intrinsic type microcrystalline silicon layer 134 formed over the p-type microcrystalline silicon layer 132, and an n-type amorphous silicon layer 136 formed over the intrinsic type microcrystalline silicon layer 134. In certain embodiments, the p-type microcrystalline silicon layer 132 may be formed to a thickness between about 100 Å and about 400 Å. In certain embodiments, the intrinsic type microcrystalline silicon layer 134 may be formed to a thickness between about 10,000 Å and about 30,000 Å. In certain embodiments, the n-type amorphous silicon layer 136 may be formed to a thickness between about 100 Å and about 500 Å.

The metal back layer 150 may include, but not limited to a material selected from the group consisting of Al, Ag, Ti, Cr, Au, Cu, Pt, alloys thereof, or combinations thereof. Other processes may be performed to form the solar cell 100, such a laser scribing processes. Other films, materials, substrates, and/or packaging may be provided over metal back layer 150 to complete the solar cell. The solar cells may be interconnected to form modules, which in turn can be connected to form arrays.

Solar radiation 101 is absorbed by the intrinsic layers of the p-i-n junctions 120, 130 and is converted to electron-holes pairs. The electric field created between the p-type layer and the n-type layer that stretches across the intrinsic layer causes electrons to flow toward the n-type layers and holes to flow toward the p-type layers creating current. The first p-i-n junction 120 comprises an intrinsic type amorphous silicon layer 124 and the second p-i-n junction 130 comprises an intrinsic type microcrystalline silicon layer 134 because amorphous silicon and microcrystalline silicon absorb different wavelengths of solar radiation 101. Therefore, the solar cell 100 is more efficient since it captures a larger portion of the solar radiation spectrum. The intrinsic layer of amorphous silicon and the intrinsic layer of microcrystalline are stacked in such a way that solar radiation 101 first strikes the intrinsic type amorphous silicon layer 124 and then strikes the intrinsic type microcrystalline silicon layer 134 since amorphous silicon has a larger bandgap than microcrystalline silicon. Solar radiation not absorbed by the first p-i-n junction 120 continues on to the second p-i-n junction 130. It was surprising to find that the thicknesses disclosed herein of the p-i-n layers of the first p-i-n junction 120 and the second p-i-n junction 130 provided for a solar cell with improved efficiency and with a reduced cost of producing the same. Not wishing to be bound by theory unless explicitly recited in the claims, it is believed that on one hand a thicker intrinsic layer 124, 134 is beneficial to absorb a greater amount of the solar radiation spectrum and that on the other hand if the intrinsic layer 124, 134 and/or the p-i-n junctions 120, 130 are too thick the flow of electrons therethrough would be hampered.

In one aspect, the solar cell 100 does not need to utilize a metal tunnel layer between the first p-i-n junction 120 and the second p-i-n junction 130. The n-type microcrystalline silicon layer 126 of the first p-i-n junction 120 and the p-type microcrystalline silicon layer 132 has sufficient conductivity to provide a tunnel junction to allow electrons to flow from the first p-i-n junction 120 to the second p-i-n junction 130.

In one aspect, it is believed that the n-type amorphous silicon layer 136 of the second p-i-n junction 130 provides increased cell efficiency since it is more resistant to attack from oxygen, such as the oxygen in air. Oxygen may attack the silicon films and thus forming impurities which lower the capability of the films to participate in electron/hole transport therethrough.

Figure 2:
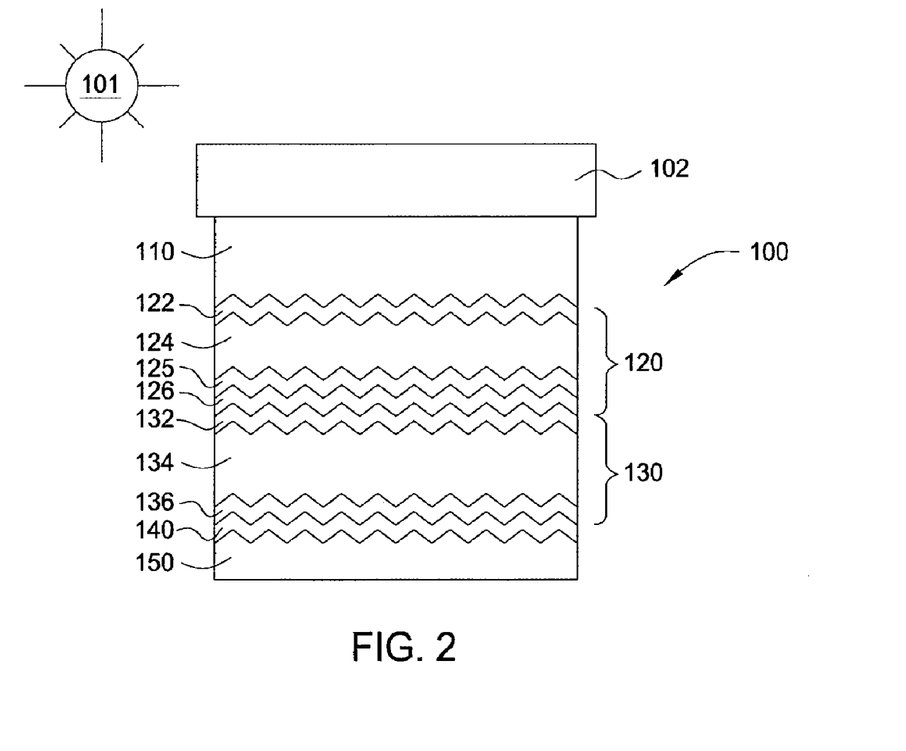
FIG. 2 is a schematic diagram of the multi-junction solar cell of FIG. 1 further comprising an n-type amorphous silicon buffer layer.

FIG. 2 is a schematic diagram of the multi-junction solar cell 100 of FIG. 1 further comprising an n-type amorphous silicon buffer layer 125 formed between the intrinsic type amorphous silicon layer 124 and the n-type microcrystalline silicon layer 126. In certain embodiments, the n-type amorphous silicon buffer layer 125 may be formed to a thickness between about 10 Å and about 200 Å. It is believed that the n-type amorphous silicon buffer layer 125 helps bridge the bandgap offset that is believed to exist between the intrinsic type amorphous silicon layer 124 and the n-type microcrystalline silicon layer 126. Thus it is believed that cell efficiency is improved due to enhanced current collection.

Figure 3:
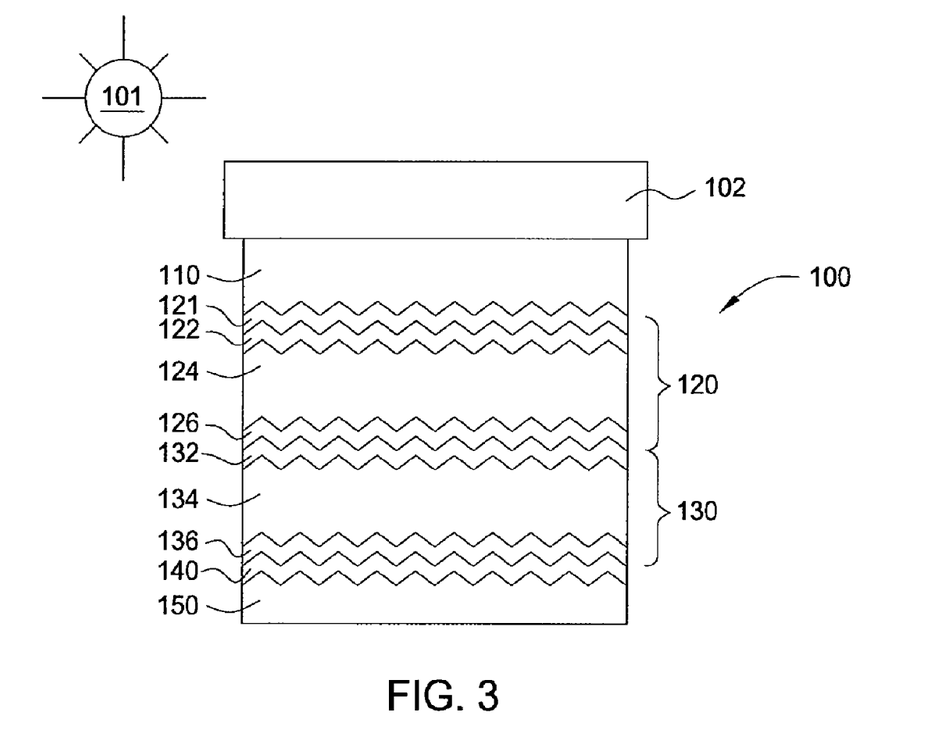
FIG. 3 is a schematic diagram of the multi-junction solar cell of FIG. 1 further comprising a p-type microcrystalline silicon contact layer.

FIG. 3 is a schematic diagram of the multi-junction solar cell 100 of FIG. 1 further comprising a p-type microcrystalline silicon contact layer 121 formed between the first TCO layer 110 and the p-type amorphous silicon layer 122. In certain embodiments, the p-type microcrystalline silicon contact layer 121 may be formed to a thickness between about 60 Å and about 300 Å. It is believed that the p-type microcrystalline silicon contact layer 121 helps achieve low resistance contact with the TCO layer. Thus, it is believed that cell efficiency is improved since current flow between the intrinsic type amorphous silicon layer 122 and the zinc oxide first TCO layer 110 is improved. It is preferred that the p-type microcrystalline silicon contact layer 121 be used with a TCO layer comprising a material that is resistant to a hydrogen plasma, such as zinc oxide, since a large amount of hydrogen is used to form the contact layer. It has been found that tin oxide is not suitable to be used in conjunction with the p-type microcrystalline silicon contact layer since it is chemically reduced by the hydrogen plasma. It is further understood that the solar cell 100 may further comprise an optional n-type amorphous silicon buffer layer formed between the intrinsic type amorphous silicon layer 124 and the n-type microcrystalline semiconductor layer 126 as described in FIG. 2.

Figure 4:
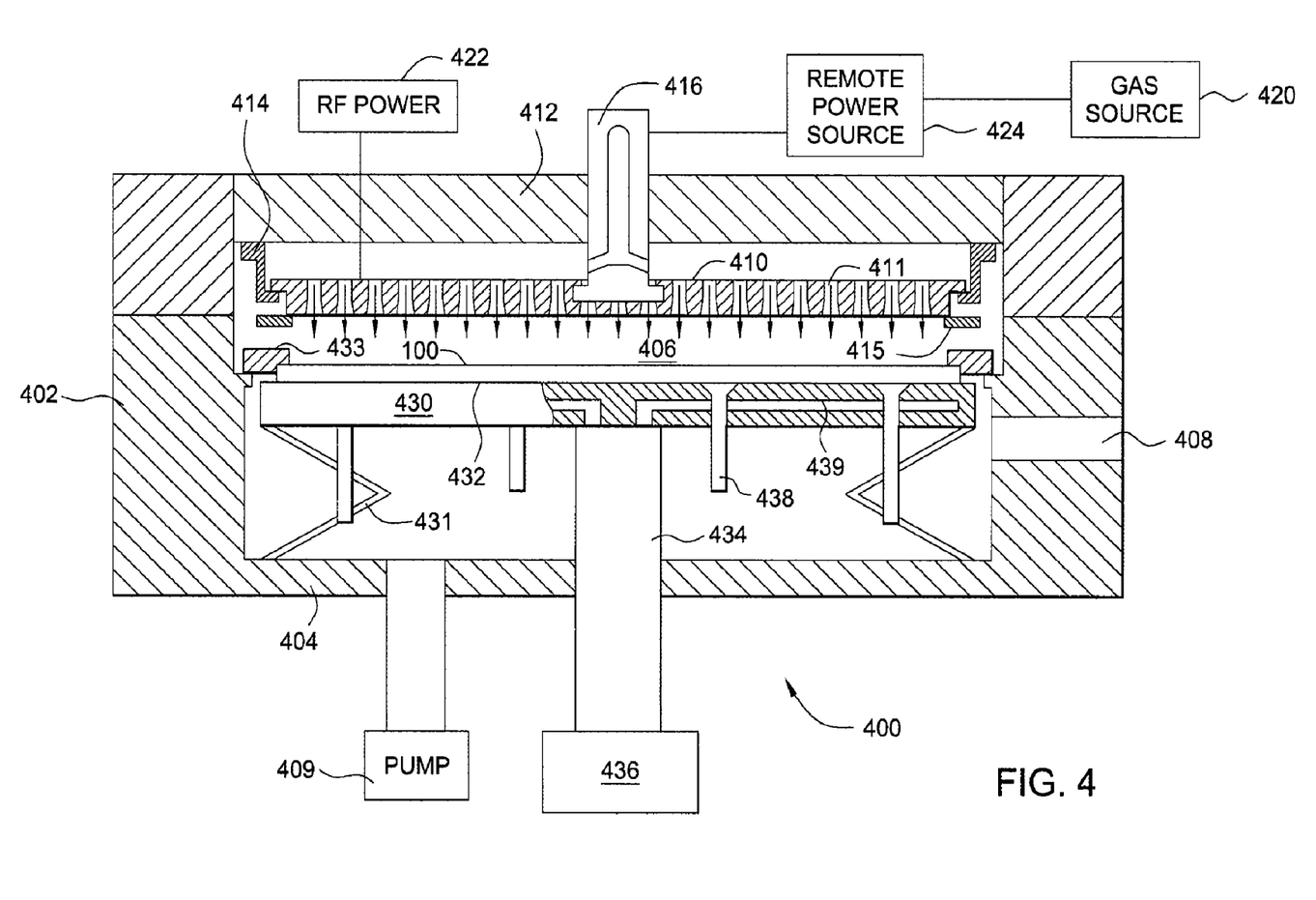
FIG. 4 is a schematic cross-section view of one embodiment of a plasma enhanced chemical vapor deposition (PECVD) chamber in which one or more films of a solar cell may be deposited.

FIG. 4 is a schematic cross-section view of one embodiment of a plasma enhanced chemical vapor deposition (PECVD) chamber 400 in which one or more films of a solar cell, such as the solar cell 100 of FIG. 1, FIG. 2, or FIG. 3, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 400 generally includes walls 402, a bottom 404, and a showerhead 410, and substrate support 430 which define a process volume 406. The process volume is accessed through a valve 408 such that the substrate, such as substrate 100, may be transferred in and out of the chamber 400. The substrate support 430 includes a substrate receiving surface 432 for supporting a substrate and stem 434 coupled to a lift system 436 to raise and lower the substrate support 430. A shadow from 433 may be optionally placed over periphery of the substrate 100. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the showerhead 410 to the substrate receiving surface 432. A vacuum pump 409 is coupled to the chamber 400 to control the process volume 406 at a desired pressure. An RF power source 422 is coupled to the backing plate 412 and/or to the showerhead 410 to provide a RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

The deposition methods for one or more silicon layers, such as one or more of the silicon layers of solar cell 100 of FIG. 1, FIG. 2, or FIG. 3, may include the following deposition parameters in the process chamber of FIG. 4 or other suitable chamber. A substrate having a surface area of 10,000 $cm^2$ or more, preferably 40,000 $cm^2$ or more, and more preferably 55,000 $cm^2$ or more is provided to the chamber. It is understood that after processing the substrate may be cut to form smaller solar cells.

In one embodiment, the heating and/or cooling elements 439 may be set to provide a substrate support temperature during deposition of about 400 degrees Celsius or less, preferably between about 100 degrees Celsius and about 400 degrees Celsius, more preferably between about 150 degrees Celsius and about 300 degrees Celsius, such as about 200 degrees Celsius.

The spacing during deposition between the top surface of a substrate disposed on the substrate receiving surface 432 and the showerhead 410 may be between 400 mil and about 1,200 mil, preferably between 400 mil and about 800 mil.

For deposition of silicon films, a silicon-based gas and a hydrogen-based gas are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to hydrogen gas ($H_2$). The p-type dopants of the p-type silicon layers may each comprise a group III element, such as boron or aluminum. Preferably, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. Preferably, TMB is used as the p-type dopant. The n-type dopants of the n-type silicon layer may each comprise a group V element, such as phosphorus, arsenic, or antimony. Preferably, phosphorus is used as the n-type dopant. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if a hydrogen gas is provided as the carrier gas, such as for the dopant, the carrier gas flow rate should be subtracted from the total flow rate of hydrogen to determine how much additional hydrogen gas should be provided to the chamber.

Certain embodiments of depositing a p-type microcrystalline silicon contact layer, such as contact layer 121 of FIG. 3, may comprise providing a gas mixture of hydrogen gas to silane gas in ratio of about 200:1 or greater. Silane gas may be provided at a flow rate between about 0.1 sccm/L and about 0.8 sccm/L. Hydrogen gas may be provided at a flow rate between about 60 sccm/L and about 500 sccm/L. Trimethylboron may be provided at a flow rate between about 0.0002 sccm/L and about 0.0016 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L. The flow rates in the present disclosure are expressed as sccm per interior chamber volume. The interior chamber volume is defined as the volume of the interior of the chamber in which a gas can occupy. For example, the interior chamber volume of chamber 400 is the volume defined by the backing plate 412 and by the walls 402 and bottom 404 of the chamber minus the volume occupied therein by the showerhead assembly (i.e., including the showerhead 410, suspension 414, center support 415) and by the substrate support assembly (i.e., substrate support 430, grounding straps 431). An RF power between about 50 milliWatts/$cm^2$ and about 700 milliWatts/$cm^2$ may be provided to the showerhead. The RF powers in the present disclosure are expressed as Watts supplied to an electrode per substrate area. For example, for a RF power of 10,385 Watts supplied to a showerhead to process a substrate having dimensions of 220 cm×260 cm, the RF power would be 10,385 Watts/(220 cm×260 cm)=180 milliWatts/$cm^2$. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon contact layer may be about 10 Å/min or more. The p-type microcrystalline silicon contact layer has a crystalline fraction between about 20 percent and about 80 percent, preferably between 50 percent and about 70 percent.

Certain embodiments of depositing a p-type amorphous silicon layer, such as the silicon layer 122 of FIG. 1, FIG. 2, or FIG. 3, may comprise providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. In other words, if trimethylboron is provided in a 0.5% molar or volume concentration in a carrier gas, then the dopant/carrier gas mixture may be provided at a flow rate between about 1 sccm/L and about 10 sccm/L. Methane may be provided at a flow rate between about 1 sccm/L and 15 sccm/L. An RF power between about 15 milliWatts/cm$^2$ and about 200 milliWatts/cm$^2$ may be provided to the showerhead. The pressure of the chamber is maintained between about 0.1 Torr and 20 Torr, preferably between about 1 Torr and about 4 Torr. The deposition rate of the p-type amorphous silicon layer may be about 100 Å/min or more. Methane or other carbon containing compounds, such $C_3H_8$, $C_4H_{10}$, $C_2H_2$, can be used to improve the window properties (e.g. to lower absorption of solar radiation) of p-type amorphous silicon layer. Thus, an increased amount of solar radiation may be absorbed through the intrinsic layers and thus cell efficiency is improved.

Certain embodiments of depositing an intrinsic type amorphous silicon layer, such as the silicon layer 124 of FIG. 1, FIG. 2, or FIG. 3, comprises providing a gas mixture of hydrogen gas to silane gas in a ratio of about 20:1 or less. Silane gas may be provided at a flow rate between about 0.5 sccm/L and about 7 sccm/L. Hydrogen gas may be provided at a flow rate between about 5 sccm/L and 60 sccm/L. An RF power between 15 milliWatts/cm$^2$ and about 250 milliWatts/cm$^2$ may be provided to the showerhead. The pressure of the chamber may be maintained between about 0.1 Torr and 20 Torr, preferably between about 0.5 Torr and about 5 Torr. The deposition rate of the intrinsic type amorphous silicon layer may be about 100 Å/min or more.

Certain embodiments of depositing an n-type amorphous silicon buffer layer, such as the silicon layer 125 of FIG. 2, comprise providing hydrogen gas to silicon gas in a ratio of about 20:1 or less. Silane gas may be provided at a flow rate between about 1 sccm/L and about 10 sccm/L. Hydrogen gas may be provided at a flow rate between about 4 sccm/L and about 50 sccm/L. Phosphine may be provided at a flow rate between about 0.0005 sccm/L and about 0.0075 sccm/L. In other words, if phosphine is provided in a 0.5% molar or volume concentration in a carrier gas, then the dopant/carrier gas mixture may be provided at a flow rate between about 0.1 sccm/L and about 1.5 sccm/L. An RF power between about 15 milliWatts/cm$^2$ and about 250 milliWatts/cm$^2$ may be provided to the showerhead. The pressure of the chamber may be maintained between about 0.1 Torr and 20 Torr, preferably between about 0.5 Torr and about 4 Torr. The deposition rate of the n-type amorphous silicon buffer layer may be about 200 Å/min or more.

Certain embodiments of depositing a n-type microcrystalline silicon layer, such as the silicon layer 126 of FIG. 1, FIG. 2, or FIG. 3, may comprise providing a gas mixture of hydrogen gas to silane gas in a ratio of about 100:1 or more. Silane gas may be provided at a flow rate between about 0.1 sccm/L and about 0.8 sccm/L. Hydrogen gas may be provided at a flow rate between about 30 sccm/L and about 250 sccm/L. Phosphine may be provided at a flow rate between about 0.0005 sccm/L and about 0.004 sccm/L. In other words, if phosphine is provided in a 0.5% molar or volume concentration in a carrier gas, then the dopant/carrier gas may be provided at a flow rate between about 0.1 sccm/L and about 0.8 sccm/L. An RF power between about 100 milliWatts/cm$^2$ and about 900 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the n-type microcrystalline silicon layer may be about 50 Å/min or more. The n-type microcrystalline silicon layer has a crystalline fraction between about 20 percent and about 80 percent, preferably between 50 percent and about 70 percent.

Certain embodiments of depositing a p-type microcrystalline silicon layer, such as silicon layer 132 of FIG. 1, FIG. 2, or FIG. 3, comprises providing a gas mixture of hydrogen gas to silane gas in a ratio of about 200:1 or greater. Silane gas may be provided at a flow rate between about 0.1 sccm/L and about 0.8 sccm/L. Hydrogen gas may be provided at a flow rate between about 60 sccm/L and about 500 sccm/L. Trimethylboron may be provided at a flow rate between about 0.0002 sccm/L and about 0.0016 sccm/L. In other words, if trimethylboron is provided in a 0.5% molar or volume concentration in a carrier gas, then the dopant/carrier gas mixture may be provided at a flow rate between about 0.04 sccm/L and about 0.32 sccm/L. An RF power between about 50 milliWatts/cm$^2$ and about 700 milliWatts/cm$^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon layer may be about 10 Å/min or more. The p-type microcrystalline silicon contact layer has a crystalline fraction between about 20 percent and about 80 percent, preferably between 50 percent and about 70 percent.

Certain embodiments of depositing an intrinsic type microcrystalline silicon layer, such as silicon layer 134 of FIG. 1, FIG. 2, or FIG. 3, may comprise providing a gas mixture of silane gas to hydrogen gas in a ratio between 1:20 and 1:200. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. An RF power between about 300 milliWatts/cm$^2$ or greater, preferably 600 milliWatts/cm$^2$ or greater, may be provided to the showerhead. In certain embodiments, the power density may be ramped down from a first power density to a second power density during deposition. The pressure of the chamber is maintained between about 1 Torr and about 100 Torr, preferably between about 3 Torr and about 20 Torr, more preferably between about 4 Torr and about 12 Torr. The deposition rate of the intrinsic type microcrystalline silicon layer may be about 200 Å/min or more, preferably 500 Å/min. Methods and apparatus for deposited microcrystalline intrinsic layer are disclosed in U.S. patent application Ser. No. 11/426,127 filed Jun. 23, 2006, entitled "Methods and Apparatus for Depositing a Microcrystalline Silicon Film for Photovoltaic Device," which is incorporated by reference in its entirety to the extent not inconsistent with the present disclosure. The microcrystalline silicon intrinsic layer has a crystalline fraction between about 20 percent and about 80 percent, preferably between 55 percent and about 75 percent. It was surprising to find that a microcrystalline silicon intrinsic layer having a crystalline fraction of about 70% or below provided an increase in open circuit voltage and leads to higher cell efficiency.

Certain embodiments of a method depositing a n-type amorphous silicon layer, such as the silicon layer 136 of FIG. 1, FIG. 2, or FIG. 3, may comprise depositing an optional first n-type amorphous silicon layer at a first silane flow rate and depositing a second n-type amorphous silicon layer over the first optional n-type amorphous silicon layer at a second silane flow rate lower than the first silane flow rate. The first optional n-type amorphous silicon layer may comprise providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 4 sccm/L and about 40 sccm/L. Phosphine may be provided at a flow rate between about 0.0005 sccm/L and about 0.0075 sccm/L. In other words, if phosphine is provided in a 0.5% molar or volume concentration in a carrier gas, then the dopant/carrier gas mixture may be provided at a flow rate between about 0.1 sccm/L and about 1.5 sccm/L. An RF power between 25 milliWatts/cm$^2$ and about 250 milliWatts/cm$^2$ may be provided to the showerhead. The pressure of the chamber may be maintained between about 0.1 Torr and about 20 Torr, preferably between about 0.5 Torr and about 4 Torr. The deposition rate of the first n-type type amorphous silicon layer may be about 200 Å/min or more. The second n-type amorphous silicon layer may comprise providing a gas mixture of hydrogen gas to silane gas in a ratio of about 20:1 or less. Silane gas may be provided at a flow rate between about 0.1 sccm/L and about 1 sccm/L. Hydrogen gas may be provided at a flow rate between about 1 sccm/L and about 10 sccm/L. Phosphine may be provided at a flow rate between 0.01 sccm/L and about 0.075 sccm/L. In other words, if phosphine is provided in a 0.5% molar or volume concentration in a carrier gas, then the dopant/carrier gas mixture may be provided at a flow rate between about 2 sccm/L and about 15 sccm/L. An RF power between 25 milliWatts/cm$^2$ and about 250 milliWatts/cm$^2$ may be provided to the showerhead. The pressure of the chamber may be maintained between about 0.1 Torr and about 20 Torr, preferably between about 0.5 Torr and about 4 Torr. The deposition rate of the second n-type type amorphous silicon layer may be about 100 Å/min or more. The second n-type amorphous silicon layer is heavily doped and has a resistivity of about 500 Ohm-cm or below. It is believed that the heavily n-type doped amorphous silicon provides improved ohmic contact with a TCO layer, such as layer TCO layer 140. Thus, cell efficiency is improved. The optional first n-type amorphous silicon is used to increase the deposition rate for the entire n-type amorphous silicon layer. It is understood that the n-type amorphous silicon layer may be formed without the optional first n-type amorphous silicon and may be formed primarily of the heavily doped second n-type amorphous layer.

Figure 5:
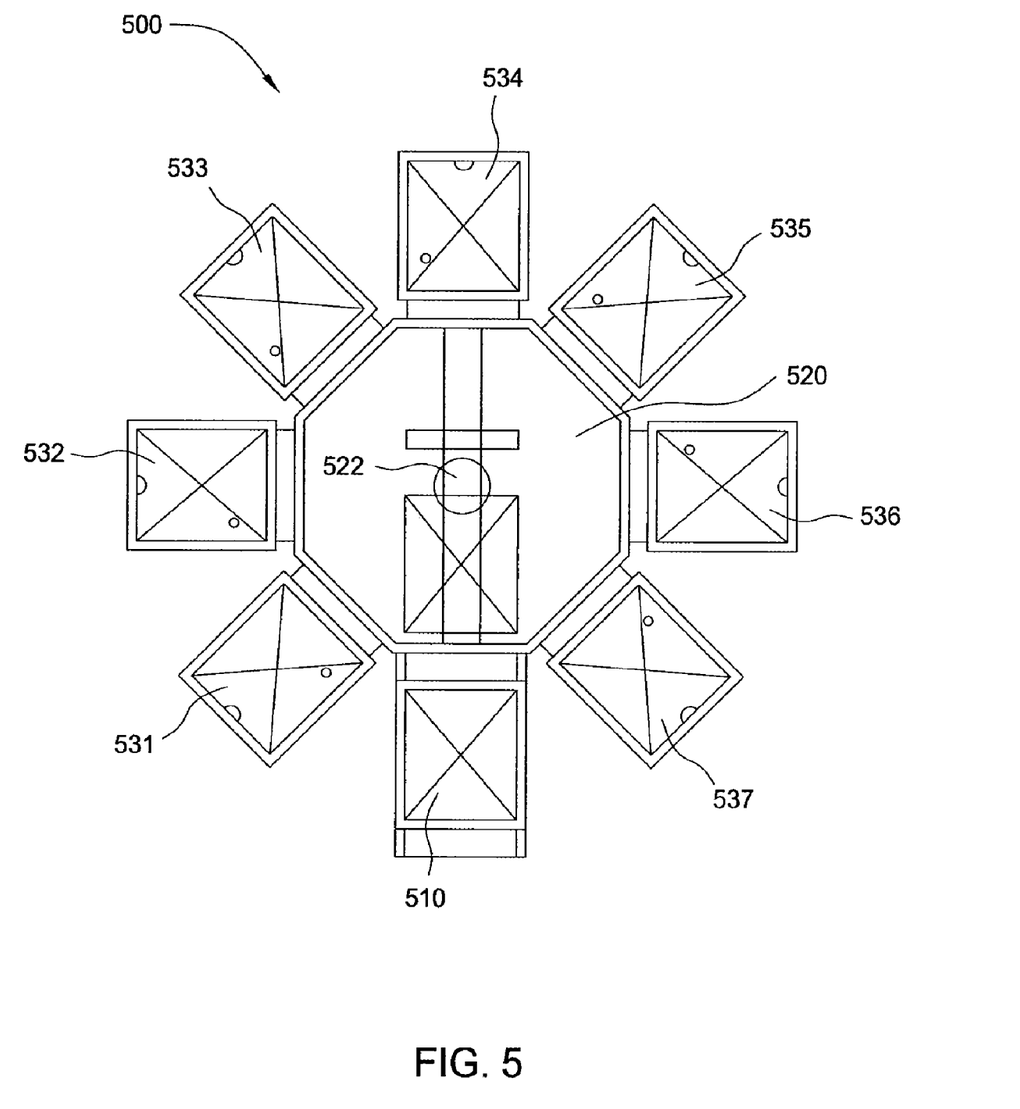
FIG. 5 is a top schematic view of one embodiment of a process system having a plurality of process chambers.

FIG. 5 is a top schematic view of one embodiment of a process system 500 having a plurality of process chambers 531-537, such as PECVD chambers chamber 400 of FIG. 4 or other suitable chambers capable of depositing silicon films. The process system 500 includes a transfer chamber 520 coupled to a load lock chamber 510 and the process chambers 531-537. The load lock chamber 510 allows substrates to be transferred between the ambient environment outside the system and vacuum environment within the transfer chamber 520 and process chambers 531-537. The load lock chamber 510 includes one or more evacuatable regions holding one or more substrate. The evacuatable regions are pumped down during input of substrates into the system 500 and are vented during output of the substrates from the system 500. The transfer chamber 520 has at least one vacuum robot 522 disposed therein that is adapted to transfer substrates between the load lock chamber 510 and the process chambers 531-537. Seven process chambers are shown in FIG. 5; however, the system may have any suitable number of process chambers.

In certain embodiments of the invention, one system 500 is configured to deposit the first p-i-n junction comprising an intrinsic type amorphous silicon layer(s) of a multi-junction solar cell, such as the first p-i-n junction 120 of FIG. 1, FIG. 2, or FIG. 3. One of the process chambers 531-537 is configured to deposit the p-type silicon layer(s) of the first p-i-n junction while the remaining process chambers 531-537 are each configured to deposit both the intrinsic type amorphous silicon layer(s) and the n-type silicon layer(s). The intrinsic type amorphous silicon layer(s) and the n-type silicon layer(s) of the first p-i-n junction may be deposited in the same chamber without any passivation process in between the deposition steps. Thus, a substrate enters the system through the load lock chamber 510, is transferred by the vacuum robot into the dedicated process chamber configured to deposit the p-type silicon layer(s), is transferred by the vacuum robot into one of the remaining process chamber configured to deposited both the intrinsic type silicon layer(s) and the n-type silicon layer(s), and is transferred by the vacuum robot back to the load lock chamber 510. In certain embodiments, the time to process a substrate with the process chamber to form the p-type silicon layer(s) is approximately 4 or more times faster, preferably 6 or more times faster, than the time to form the intrinsic type amorphous silicon layer(s) and the n-type silicon layer(s) in a single chamber. Therefore, in certain embodiments of the system to deposit the first p-i-n junction, the ratio of p-chambers to i/n-chambers is 1:4 or more, preferably 1:6 or more. The throughput of the system including the time to provide plasma cleaning of the process chambers may be about 10 substrates/hr or more, preferably 20 substrates/hr or more.

In certain embodiments of the invention, one system 500 is configured to deposit the second p-i-n junction comprising an intrinsic type microcrystalline silicon layer(s) of a multi-junction solar cell, such as the second p-i-n junction 130 of FIG. 1, FIG. 2, or FIG. 3. One of the process chambers 531-537 is configured to deposit the p-type silicon layer(s) of the first p-i-n junction while the remaining process chambers 531-537 are each configured to deposit both the intrinsic type microcrystalline silicon layer(s) and the n-type silicon layer(s). The intrinsic type microcrystalline silicon layer(s) and the n-type silicon layer(s) of the second p-i-n junction may be deposited in the same chamber without any passivation process in between the deposition steps. In certain embodiments, the time to process a substrate with the process chamber to form the p-type silicon layer(s) is approximately 4 or more times faster than the time to form the intrinsic type microcrystalline silicon layer(s) and the n-type silicon layer(s) in a single chamber. Therefore, in certain embodiments of the system to deposit the second p-i-n junction, the ratio of p-chambers to i/n-chambers is 1:4 or more, preferably 1:6 or more. The throughput of the system including the time to provide plasma cleaning of the process chambers may be about 3 substrates/hr or more, preferably 5 substrates/hr or more.

In certain embodiments, the throughput of the system 500 for depositing the first p-i-n junction comprising an intrinsic type amorphous silicon layer is approximately 2 times or more the throughput of the system 500 for depositing the second p-i-n junction comprising an intrinsic type microcrystalline silicon layer since the thickness of the intrinsic type microcrystalline silicon layer(s) is thicker than the intrinsic type amorphous silicon layer(s). Therefore, a single system 500 adapted to deposit a first p-i-n junction comprising intrinsic type amorphous silicon layer(s) can be matched with two or more systems 500 adapted to deposit a second p-i-n junction comprising intrinsic type microcrystalline silicon layer(s). Once a first p-i-n junction has been formed on one substrate in one system, the substrate may be exposed to the ambient environment (i.e., vacuum break) and transferred to the second system. A wet or dry cleaning of the substrate between the first system depositing the first p-i-n junction and the second p-i-n junction is not necessary.

EXAMPLES

The examples disclosed herein are exemplary in nature and are not meant to limit the scope of the invention unless explicitly set forth in the claims.

Figure 6:
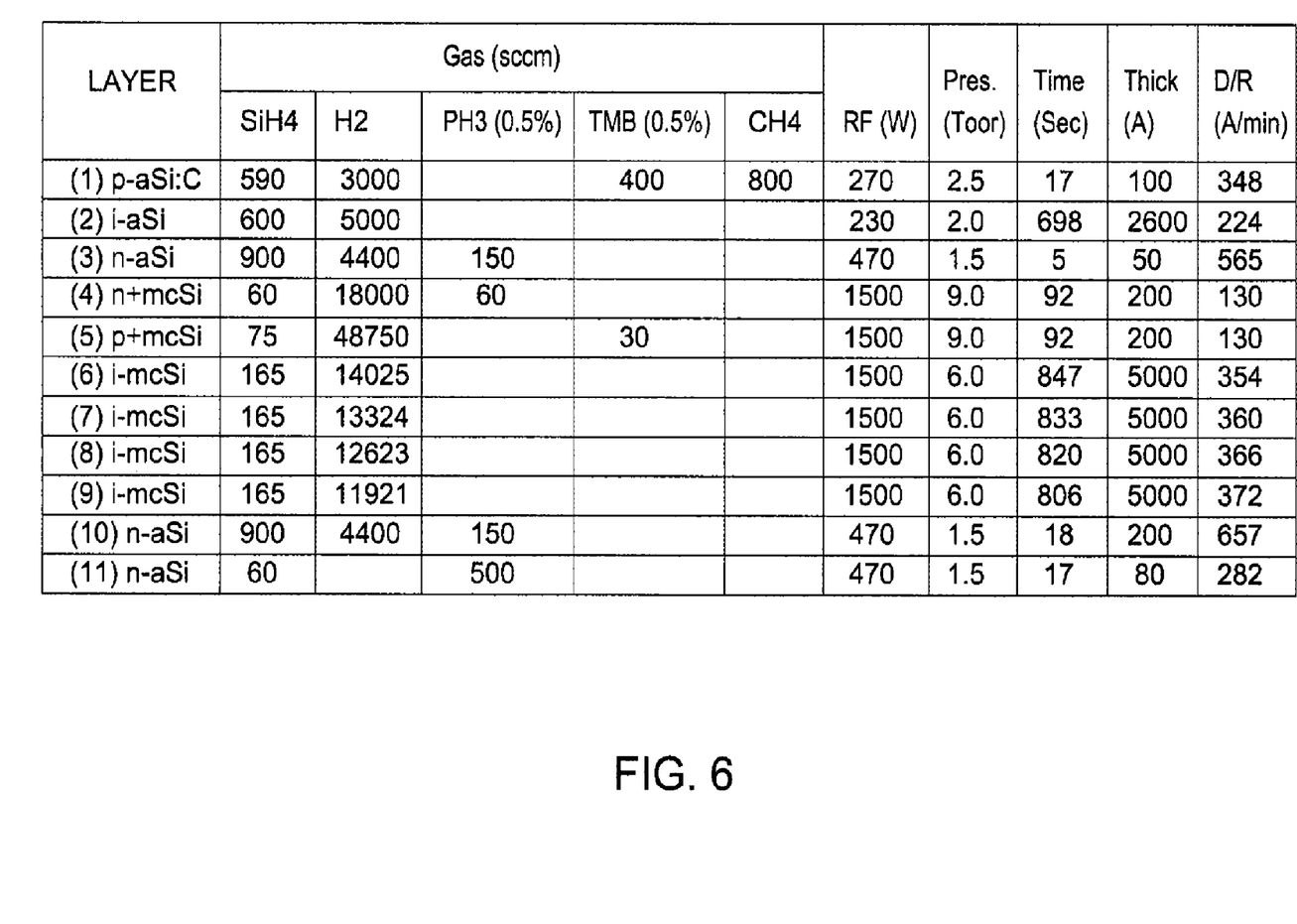
FIG. 6 depicts deposition parameters set to form a tandem p-i-n junction solar cell.
Figure 7:
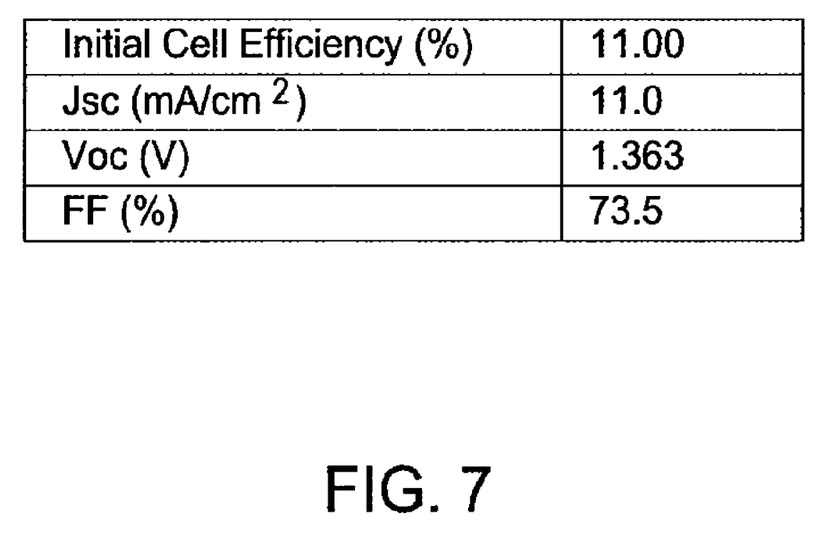
FIG. 7 depicts properties of a solar cell of one embodiment of the present invention.

Substrates having a surface area of 4,320 cm$^2$ were processed in an AKT 4300 PECVD System, available from AKT America, Inc., of Santa Clara, Calif., having an interior chamber volume of 130 liters. Layer 1 was deposited in a first chamber of the PECVD system. Layers 2-4 were deposited in a second chamber of the PECVD system. Layer 5 was deposited in a third chamber of the PECVD system. Layers 6-11 were deposited in a fourth chamber of the PECVD system. The spacing during deposition of layers 1-11 was set to 550 mil and the temperature of the substrate support was set to 200° C. The deposition parameters are set forth in the FIG. 6 to form a tandem p-i-n junction solar cell. Phosphine was provided in a 0.5% mixture in a hydrogen carrier gas. Trimethylboron was provided in a 0.5% mixture in a hydrogen carrier gas. The hydrogen gas flow rates in FIG. 6 show the hydrogen gas flow rates separate from the dopant carrier gas. The solar cell had the following properties set forth in FIG. 7.

While the foregoing is directed to embodiments of the present invention, other and further embodiments of the invention may be devised without departing from the basic scope thereof, and the scope thereof is determined by the claims that follow. For example, the process chamber if FIG. 4 has been shown in a horizontal position. It is understood that in other embodiments of the invention the process chamber may be in any non-horizontal position, such as vertical. For example, embodiments of the invention have been described in reference to the multi-process chamber cluster tool in FIG. 5. It is understood that embodiments of the invention may also be practiced in on in-line systems and hybrid in-line/cluster systems. For example, embodiments of the invention have been described in reference to a first system configured to form a first p-i-n junction and a second p-i-n junction. It is understood that in other embodiments of the invention, the first p-i-n junction and a second p-i-n junction may be formed in a single system. For example, embodiments of the invention have been described in reference to a process chamber adapted to deposit both an intrinsic type layer and an n-type layer. It is understood that in other embodiments of the invention, separate chambers may be adapted to deposit the intrinsic type layer and the n-type layer. It is understood that in other embodiments of the invention, a process chamber may be adapted to deposit both a p-type layer and an intrinsic type layer.

The invention claimed is:

1. A method of forming a thin film multi-junction solar cell over a substrate, comprising:
    forming a first p-i-n junction, comprising:
        forming a p-type amorphous silicon layer;
        forming an intrinsic type amorphous silicon layer over the p-type amorphous silicon layer; and
        forming an n-type microcrystalline silicon layer over the intrinsic type amorphous silicon layer; and
    forming a second p-i-n junction over the first p-i-n junction, comprising:
        forming a p-type microcrystalline silicon layer;
        forming an intrinsic type microcrystalline silicon layer over the p-type microcrystalline silicon layer; and
        forming an n-type amorphous silicon layer over the intrinsic type microcrystalline layer.

2. The method of claim 1, wherein forming the first p-i-n junction further comprises forming an n-type amorphous silicon buffer layer between the intrinsic type amorphous silicon layer and the n-type microcrystalline silicon layer.

3. The method of claim 1, wherein the first p-i-n junction is formed over a zinc oxide transparent conducting oxide layer.

4. The method of claim 3, wherein the first p-i-n junction further comprises a p-type microcrystalline contact layer formed between the zinc oxide transparent conducting oxide layer and the p-type amorphous silicon layer.

5. The method of claim 1, wherein the p-type amorphous silicon layer of the first p-i-n junction is formed to a thickness between about 60 Å and about 300 Å; wherein the intrinsic type amorphous silicon layer of the first p-i-n junction is formed to a thickness between about 1,500 Å and about 3,500 Å; and wherein the n-type microcrystalline silicon layer of the first p-i-n junction is formed to a thickness between about 100 Å and about 400 Å.

6. The method of claim 1, wherein the p-type microcrystalline silicon layer of the second p-i-n junction is formed to a thickness between about 100 Å and about 400 Å; wherein the intrinsic type microcrystalline silicon layer of the second p-i-n junction is formed to a thickness between about 10,000 Å and about 30,000 Å; and wherein the n-type amorphous silicon layer is formed to a thickness between about 100 Å and about 500 Å.

7. The method of claim of claim 2, wherein the n-type amorphous silicon buffer layer is formed to a thickness between about 10 Å and about 200 Å.

8. The method of claim 4, wherein the p-type microcrystalline contact layer is formed to a thickness between about 60 Å and about 300 Å.

9. The method of claim 1, wherein the first p-i-n junction is formed in a first process system comprising a first process chamber and a second process chamber.

10. The method of claim 9, wherein the p-type amorphous silicon layer of the first p-i-n junction is formed in the first process chamber of the first process system and wherein the intrinsic type amorphous silicon layer and the n-type microcrystalline silicon layer are formed in the second process chamber of the first process system.

11. The method of claim 10, wherein forming the first p-i-n junction further comprises forming an n-type amorphous silicon buffer layer between the intrinsic type amorphous silicon layer and the n-type microcrystalline silicon layer in the second process chamber of the first system.

12. The method of claim 10, wherein forming the first p-i-n junction further comprises forming a p-type microcrystalline contact layer prior to forming the p-type amorphous silicon layer in the first process chamber of the first process system.

13. The method of claim 9, wherein the second p-i-n junction is formed in a second process system comprising a first process chamber and a second process chamber.

14. The method of claim 13, wherein the p-type microcrystalline silicon layer of the first p-i-n junction is formed in the first process chamber of the second process system and wherein the intrinsic type microcrystalline silicon layer and the n-type amorphous silicon layer of the second p-i-n junction is formed in the second chamber of the second process system.

15. The method of claim 1, wherein the n-type microcrystalline silicon layer of the first p-i-n junction and the p-type microcrystalline silicon layer of the second p-i-n junction have sufficient conductivity to act as the tunnel layer between the first p-i-n junction and the second p-i-n junction.

16. The method of claim 1, wherein the n-type amorphous silicon layer of the second p-i-n junction comprises a heavily doped n-type amorphous silicon layer.

17. The method of claim 16, wherein the heavily doped n-type amorphous silicon layer has a resistivity of about 500 Ohm-cm or below.

18. The method of claim 1, wherein the substrate is exposed to the ambient environment between formation of the first p-i-n junction and the second p-i-n junction.

19. The method of claim 1, wherein the p-type amorphous silicon layer is a p-type amorphous silicon-carbon layer.

20. A method of forming a thin film multi-junction solar cell over a substrate, comprising:
   providing silane gas at a flow rate between about 1 sccm/L and about 10 sccm/L, hydrogen gas at a flow rate between about 5 sccm/L and about 60 sccm/L, p-type dopant between about 0.005 sccm/L and about 0.05 sccm/L, and RF power between 15 milliWatts/cm2 and about 200 milliWatts/cm2 to form a p-type amorphous silicon layer;
   providing silane gas at a flow rate between about 0.5 sccm/L and about 7 sccm/L, hydrogen gas at a flow rate between about 5 sccm/L and about 60 sccm/L, and RF power between 15 milliWatts/cm2 and about 250 milliWatts/cm2 to form an intrinsic type amorphous silicon layer;
   providing silane gas at a flow rate between about 0.1 sccm/L and about 0.8 sccm/L, hydrogen gas at a flow rate between about 30 sccm/L and about 250 sccm/L, n-type dopant between about 0.0005 sccm/L and about 0.004 sccm/L, and RF power between about 100 milliWatts/cm2 and about 900 milliWatts/cm2 to form an n-type microcrystalline silicon layer;
   providing silane gas at a flow rate between 0.1 sccm/L and about 0.8 sccm/L, hydrogen gas at a flow rate between 60 sccm/L and about 500 sccm/L, p-type dopant at a flow rate between 0.0002 sccm/L and about 0.0016 sccm/L, RF power between 50 milliWatts/cm2 and about 700 milliWatts/cm2 to form a p-type microcrystalline silicon layer;
   providing silane gas at a flow rate between 0.5 sccm/L and about 5 sccm/L, hydrogen gas at a flow rate between 40 sccm/L and about 400 sccm, and RF power between about 300 milliWatts/cm2 or greater to form an intrinsic type microcrystalline silicon layer; and
   providing silane gas at a flow rate between about 0.1 sccm/L and about 1 sccm/L, hydrogen gas between about 1 sccm/L and about 10 sccm/L, n-type dopant between 0.01 sccm/L and about 0.075 sccm/L to form a n-type amorphous silicon layer.

21. The method of claim 20, further comprising providing silane gas at a flow rate between about 0.1 sccm/L and about 0.8 sccm/L, hydrogen gas at a flow rate between about 60 sccm/L and about 500 sccm/L, p-type dopant between about 0.0002 sccm/L and about 0.0016 sccm/L, and RF power between about 50 milliWatts/cm2 and about 700 milliWatts/cm2 to form a p-type microcrystalline silicon contact layer.

22. The method of claim 20, further comprising providing silane at a flow rate between 1 sccm/L and about 10 sccm/L, hydrogen gas at a flow rate between 4 sccm/L and about 50 sccm/L, n-type dopant at a flow rate between about 0.0005 sccm/L and about 0.0075 sccm/L, and RF power between about 15 milliWatts/cm2 and about 250 milliWatts/cm2 to form an n-type amorphous silicon buffer layer.

23. The method of claim 20, wherein the p-type amorphous silicon layer is further formed by providing a carbon containing compound between about 1 sccm/L and about 15 sccm/L.

* * * * *

UNITED STATES PATENT AND TRADEMARK OFFICE
CERTIFICATE OF CORRECTION

PATENT NO. : 7,582,515 B2  Page 1 of 1
APPLICATION NO. : 11/671988
DATED : September 1, 2009
INVENTOR(S) : Choi et al.

It is certified that error appears in the above-identified patent and that said Letters Patent is hereby corrected as shown below:

Title Page

In the Inventors section (75):

Please delete "Soo-Young Choi" and insert --Soo Young Choi-- therefor;

In the References Cited section (56):

Please delete "JP 0 944 515 A2 4/2000" and insert --EP 0 944 515 A2 4/2000-- therefor;

Please insert --Copy of PCT Search Report and Written Opinion for PCT/US08/70900, October 14, 2008, copy consists of 13 pages. (APPM/011709PCP02).--.

Signed and Sealed this

Twenty-second Day of December, 2009

David J. Kappos
*Director of the United States Patent and Trademark Office*